(12) United States Patent  
Orofino, II et al.

(10) Patent No.: US 7,478,016 B2
(45) Date of Patent: Jan. 13, 2009

(54) BLOCK MODELING INPUT/OUTPUT BUFFER

(75) Inventors: Donald Paul Orofino, II, Sudbury, MA (US); Ramamurthy Mani, Needham, MA (US)

(73) Assignee: The MathWorks, Inc., Natick, MA (US)

( * ) Notice: Subject to any disclaimer, the term of this patent is extended or adjusted under 35 U.S.C. 154(b) by 415 days.

(21) Appl. No.: 10/417,404

(22) Filed: Apr. 16, 2003

(65) Prior Publication Data

US 2004/0210685 A1 Oct. 21, 2004

(51) Int. Cl.
G06F 7/60 (2006.01)
G06F 17/10 (2006.01)
(52) U.S. Cl. .......................................... 703/2
(58) Field of Classification Search ................ 703/2
See application file for complete search history.

(56) References Cited

U.S. PATENT DOCUMENTS

| 5,475,851 | A | * | 12/1995 | Kodosky et al. | ............ 715/763 |
| 5,732,277 | A | * | 3/1998 | Kodosky et al. | ............ 717/125 |
| 5,821,934 | A | * | 10/1998 | Kodosky et al. | ............ 715/763 |
| 6,321,310 | B1 | * | 11/2001 | McCarthy et al. | ............ 711/154 |
| 6,584,601 | B1 | * | 6/2003 | Kodosky et al. | ............... 716/4 |
| 2002/0188928 | A1 | | 12/2002 | Szpak et al. | |
| 2003/0016234 | A1 | | 1/2003 | Mani et al. | |

* cited by examiner

Primary Examiner—Paul L Rodriguez
Assistant Examiner—J C Ochoa
(74) Attorney, Agent, or Firm—Lahive & Cockfield, LLP; Kevin J. Canning

(57) ABSTRACT

A method of addressing a signal I/O buffer in a block of a block diagram model includes determining a base address, an element offset, a wrap-around size, a starting offset and a stride factor.

42 Claims, 22 Drawing Sheets

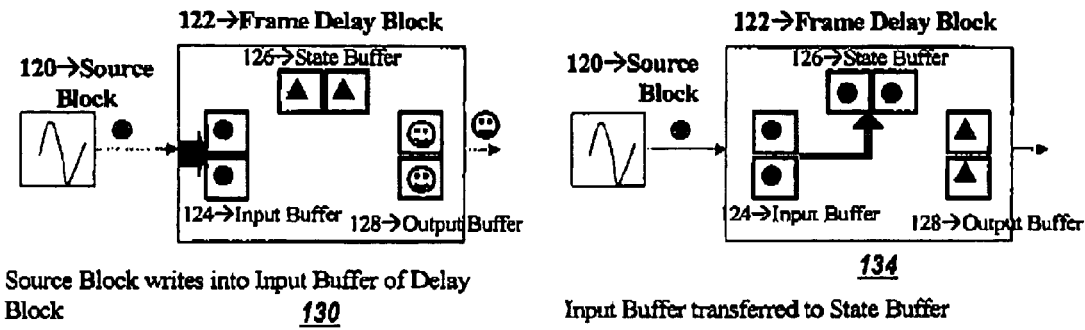
Fig. 6A
*(Prior Art)*
Source Block writes into Input Buffer of Delay Block  *130*
Fig. 6C
*(Prior Art)*
Input Buffer transferred to State Buffer  *134*
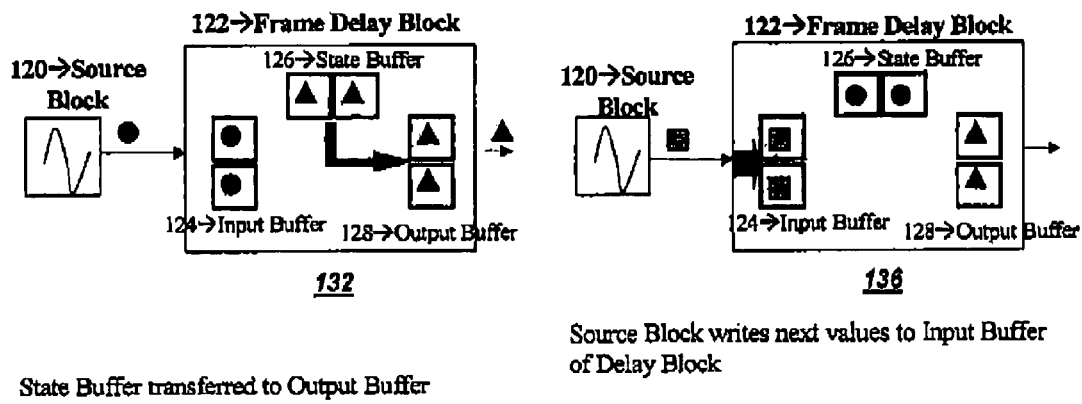
Fig. 6B
*(Prior Art)*
State Buffer transferred to Output Buffer  *132*
Fig. 6D
*(Prior Art)*
Source Block writes next values to Input Buffer of Delay Block  *136*

Source Block writes into Input-Output Buffer of Logarithm Block

Logarithm Block overwrites Input-Output Buffer with log(input) by means of an inplace computation (a) Input/Output values at execution time 'm-1'

(b) Input/Output values at execution time 'm'

Copy into input buffer

Copy into output buffer

Implementation of Signal Selector with Offset Buffer:

Input/Output values at execution time 'm-1'

Input/Output values at execution time 'm'

Traditional Implementation of Frame Buffer:

Create room for new input sample

Assign input sample to "space" in buffer

Implementation of Frame Rebuffer with Shared Circular Buffers:
Copy input sample into buffer Increment start of output buffer Input/Output values at execution time 'm'

(Assuming $N$ is even)

Copy into input buffer

Output Buffer = Every alternate element of input buffer

Circular addressing

Offset addressing

Stride addressing

BLOCK MODELING INPUT/OUTPUT BUFFER

TECHNICAL FIELD

This invention relates to a block diagram modeling Input/Output (I/O) buffer.

BACKGROUND

Block-diagram modeling simplifies a process of conceptualizing, designing, simulating, and implementing (in software or hardware) custom signal processing systems. A block-diagram model of a signal processing system is represented schematically as a collection of blocks interconnected by lines (directed arrows) that represent signals. Each block represents an elemental dynamic system. A line emanating at one block and terminating at another signifies that the output of the first block is an input to the second block. Each distinct input or output on a block is referred to as a port. Signals correspond to the time-varying data values represented by each line connection and are assumed to have values at each time instant.

Block-diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block-diagram's start and stop time. The relationships between signals and state variables are defined by sets of equations represented by blocks. These equations define a relationship between the input signals, output signals, and state variables. Inherent in the definition is the notion of parameters, which are the coefficients of the equations. The block-diagram modeling approach has spawned a variety of software products such as Simulink® that cater to various aspects of system analysis and design.

The data values of a signal are generally a collection of one or more individual data elements. Such a collection of data elements for a given signal is generally stored in a memory buffer that is called a block I/O buffer because signals correspond to the input and output ports of blocks. While data elements are largely numeric, data elements can also take other forms, such as strings or objects with multiple attributes.

One of the primary tasks of modeling software is to enable the computation and tracing of a dynamic system's outputs from its block-diagram model. An execution engine carries out the task of executing a block-diagram model in four stages: compilation, link, code generation, and execution loop. The compile stage involves checking the integrity and validity of the block interconnections in the block-diagram. In this stage, the engine also sorts the blocks in the block-diagram into hierarchical lists that indicate the order in which blocks need to be executed in order to execute the overall block-diagram. In the link stage, the engine uses the result of the compiled stage to allocate memory needed for the execution of the various components of the block-diagram. This stage also produces execution lists, distilled versions of the block sorted-lists that are suitable for efficient execution. The next stage in the engine that involves code generation is optional. In this stage, the engine could choose to translate the block-diagram model (or portions of it) into either software modules or hardware descriptions (broadly termed code). If this stage is performed, then the link and execute stages which follow would use the generated code during the execution of the block-diagram. If this stage is skipped completely, then the engine would use an interpretive mode of execution for the block-diagram. In some cases, the user can even not proceed further with the execution of the block-diagram because they would like to deploy the code outside the confines of the block-diagram software. Finally, in the execution loop stage, the engine uses an execution loop to run over the execution lists and trace the system's response over time.

SUMMARY

In an aspect, the invention features a method including in a block diagram model of a dynamic system, providing a plurality of signal input/output (I/O) types in each computational domain.

One or more of the following advantageous features can also be included. Addressing the signal I/O types can include addressing a base address, addressing an element offset, addressing a wrap-around size, addressing a starting offset, and addressing a stride factor. The base address can be a starting memory address of sequentially accessible elements of the signal I/O type. The element offset can be an offset index i that can be used in conjunction with the base address to obtain an $i^{th}$ element in the signal I/O type. The wrap-around size can be an integer index after which the signal I/O type can be considered to wrap around on itself. The starting offset can be an integer offset that determines a relative position of a first element in the signal I/O type with respect to the base address. The stride factor can be an integer that represents a spacing between elements in the signal I/O types. The signal I/O types can have flexible dimensions.

In embodiments, signal I/O types can be dedicated or shared memory spaces used to retain and convey signal values from an output of a block to inputs of one or more blocks within the block diagram. Signal I/O types can be a manner in which the I/O can be organized in memory. The computational domain can be a time-based simulation domain, a physical modeling computational domain, a data flow computational domain or a graphical programming computational domain. The I/O types can differ on each port of a multi-port block. The block diagram can include a blocks wherein one or more of the blocks negotiates signal I/O types that are used to retain signal values. Negotiation can include ranking available signal I/O types to influence the selection of signal I/O types.

In another aspect, the invention features a method of addressing a signal I/O buffer in a block of a block diagram model including determining a base address, an element offset, a wrap-around size, a starting offset and a stride factor.

One or more of the following advantageous features can also be included. The base address can be a starting memory address of sequentially accessible elements of the signal I/O buffer. The element offset can be an offset index i that can be used in conjunction with the base address to obtain an ith element in the signal I/O buffer. The wrap-around size can be an integer index after which the signal I/O buffer can be considered to wrap around on itself. The starting offset can be an integer offset that determines a relative position of a first element in the signal I/O buffer with respect to the base address. The stride factor can be an integer that represents a spacing between elements in the signal I/O buffer.

Embodiments of the invention can have one or more of the following advantages.

The I/O buffer provides for the existence of more than one type of I/O utilized in one computational domain where I/O is dedicated or shared memory spaces used to retain and convey signal values from the output of one component to the input(s) of one or more components within a model. I/O type is the way in which the I/O is organized or defined in memory, and/or the way in which elements of the memory are accessed, such that access to the I/O is best suited to one or more types of operations typically used in a block diagram model. ("Operations" includes mathematical algorithms, data reorganization, data indexing and assignment, and so forth). For example, some computational algorithms want to organize I/O memory such that successive rows of a matrix are in sequential memory locations, whereas other algorithms want successive columns of a matrix to appear in sequential memory locations. Other examples include the organization of memory such that sequential memory locations are accessed as if they were in a circular buffer of memory. Another example is reverse-order access of memory elements; this example not only influences where the data values are located, but also, the manner in which elements are accessed from that portion of memory in which the data values are written. Both the organization and methods of access to I/O is encompassed by "type of I/O."

The I/O buffer provides an ability of blocks in a model to "negotiate" the type of I/O used to exchange data between themselves. We often refer to this process as a "handshake" between blocks. Each block can have a plurality of I/O techniques that it can implement, and by a process of communicating with blocks with which it needs to effect data transfer, it negotiates a common technique to use for each data transfer. Typically the negotiation occurs once prior to the start of the simulation (or, equivalently, once prior to generating code for the model), but it could occur periodically or continuously throughout the course of the simulation (or throughout execution of the corresponding generated code).

The I/O buffer provides a choice of I/O type that can differ on each port of a multi-port block. Typically, a computational block has one or more input ports and one or more output ports. Special types of blocks include "source" blocks which have only output ports, and "sink" blocks which have only input ports. All of these types of blocks can participate in a model practicing multiple I/O types, and each type of block can provide one or more I/O types.

The I/O buffer provides a choice of I/O type that can be ranked by each block from most to least desirable, influencing the order in which a block will attempt to negotiate a common I/O technique with other blocks in the model. Desirability of a type of I/O is often algorithm-specific, and thus each block can have its own distinct notion of "better" and "worse" I/O techniques based on various goals, including efficiency of element access, reduction of memory usage, and so forth.

The I/O buffer allows a simulator to practice multiple I/O types within a model in a unified manner.

The details of one or more embodiments of the invention are set forth in the accompanying drawings and the description below. Other features, objects, and advantages of the invention will be apparent from the description and drawings, and from the claims

DESCRIPTION OF DRAWINGS

FIGS. 6A, 6B, 6C, 6D, illustrate disjoint input and output buffers.

DETAILED DESCRIPTION

Figure 1:
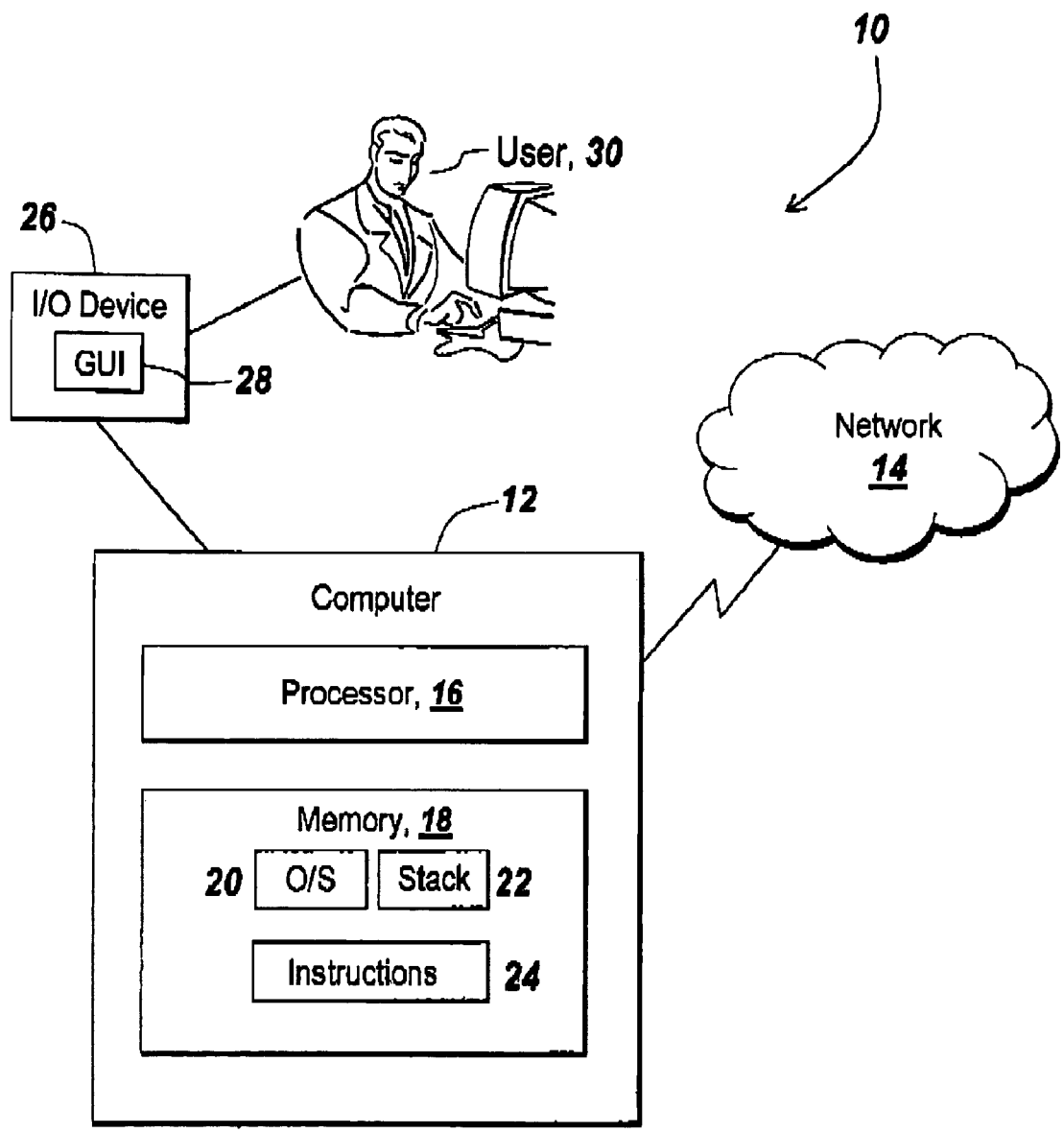
FIG. 1 is a block diagram of a system.

FIG. 1 shows a processing system 10. The processing system 10 includes a computer 12, such as a personal computer (PC). Computer 12 is connected to a network 14, such as the Internet, that runs TCP/IP (Transmission Control Protocol/Internet Protocol) or another suitable protocol. Connections can be via Ethernet, wireless link, telephone line, and so forth. Computer 12 contains a processor 16 and a memory 18. Memory 18 stores an operating system ("OS") 20 such as Windows2000® (or Linux, a TCP/IP protocol stack 22 for communicating over network 14, and machine-executable instructions 24 executed by processor 16 to perform a block diagram modeling process 50 below. Computer 12 also includes an input/output (I/O) device 26 for display of a graphical user interface (GUI) 28 to a user 30.

Figure 2:
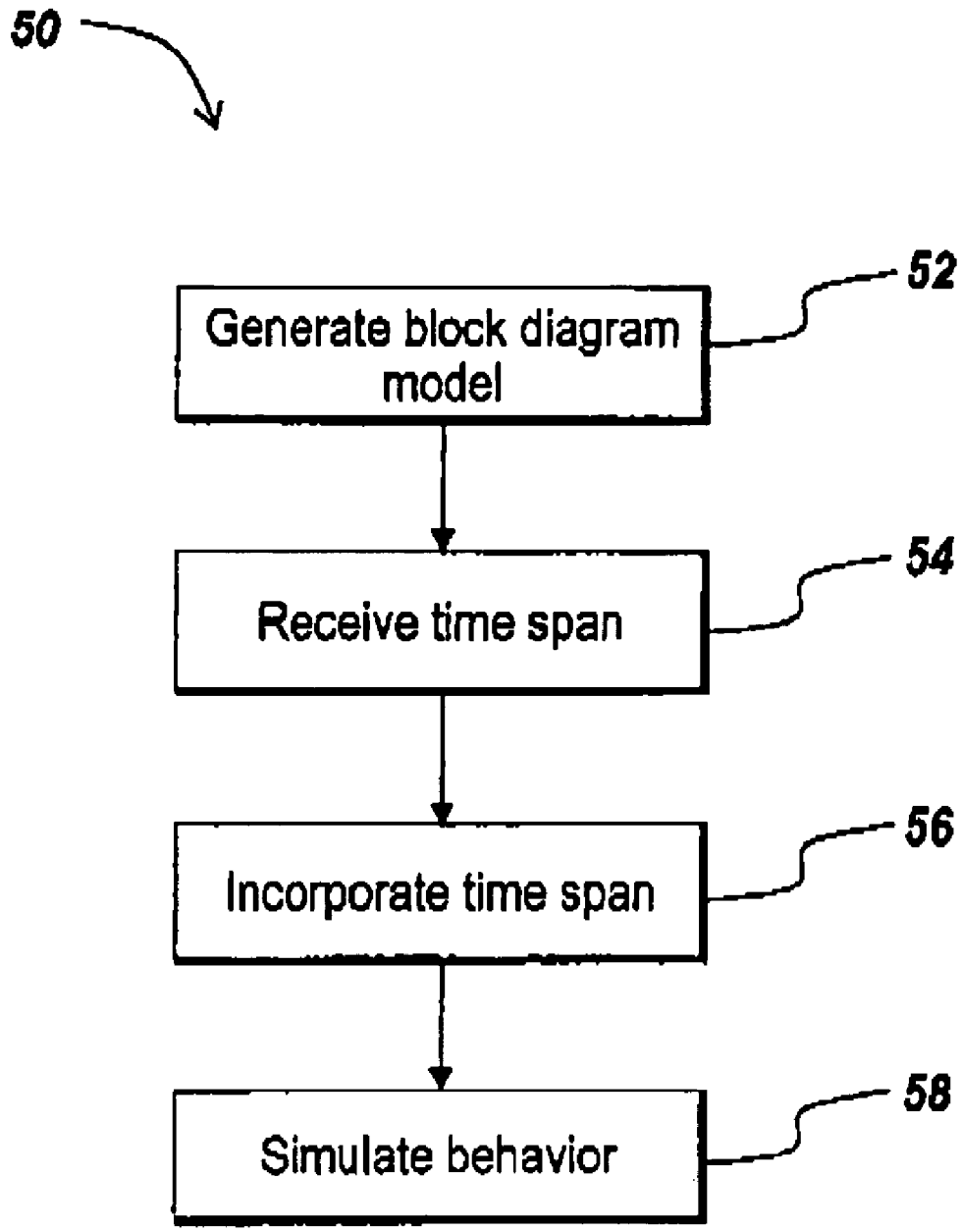
FIG. 2 is a flow diagram of a block diagram modeling process.

In FIG. 2, the block diagram modeling process 50 includes generating (52) a block diagram model of a dynamic system to be simulated and displayed on the graphical user interface (GUI) 28. The block diagram model graphically depicts the time-dependent mathematical relationships among the dynamic system's inputs, states, and outputs. The process 50 receives (54) a time span from the user 30. The process 50 incorporates (56) the time span into the block diagram model and simulates (58) the behavior of the dynamic system using the block diagram model for the specified time span.

Figure 3:
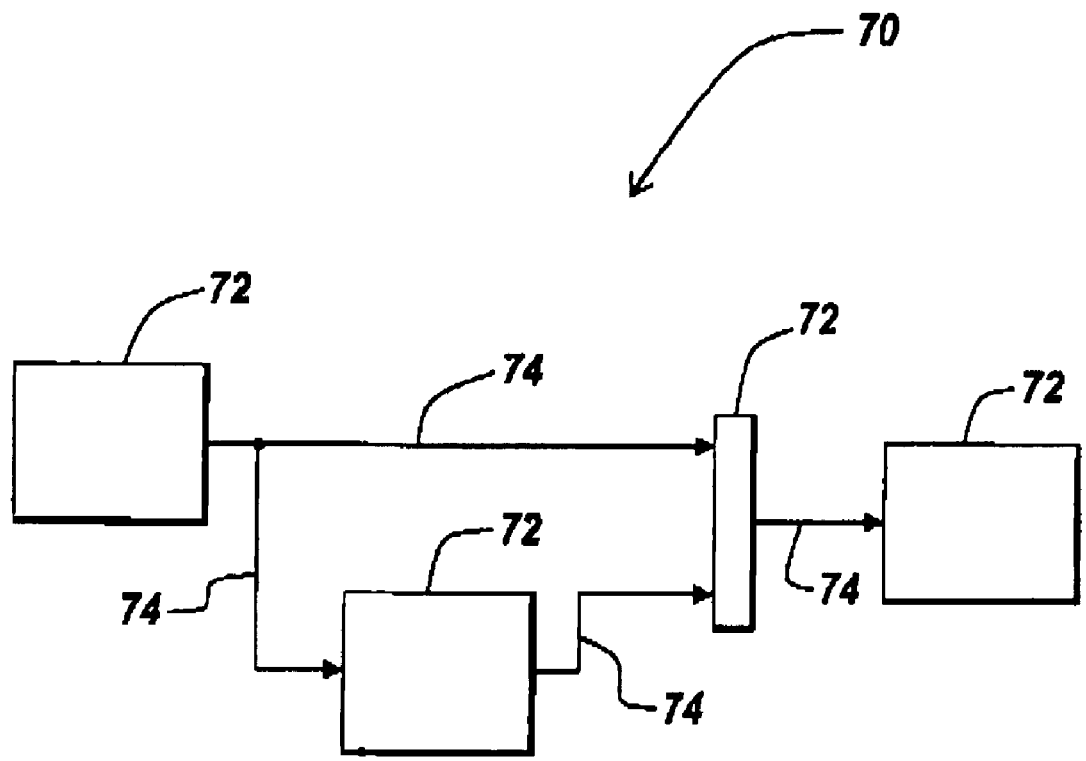
FIG. 3 is an exemplary block diagram model.

In FIG. 3, a block-diagram model 70 of a signal processing system is represented schematically as a collection of blocks 72 interconnected by lines (directed arrows) that represent signals 74. Each block 72 represents an elemental dynamic system. A line 74 emanating at one block and terminating at another signifies that the output of the first block is an input to the second block. Each distinct input or output on a block is referred to as a port. Signals 74 correspond to the time-varying data values represented by each line connection and are assumed to have values at each time instant. Each block also includes a set of states for the corresponding elemental system. Blocks with states are said to have memory because such blocks store their states at a given time in memory in order to compute the states for the next time when the block is executed. The equations corresponding to a block are generally implemented as methods corresponding to the block object in software. While there are a number of equations and methods used in the representation of dynamic systems, we concentrate here primarily on two types of methods (and equations) that are of importance in the context of signal processing systems: Output and Update. These methods are called repeatedly during the execution of the block-diagram in order to track the evolution of the dynamic system's response.

A sample time of a block is the interval of time between calls to the Output, Update, and/or Derivative methods for a given block (collectively called the execution of a block). In computing this interval, repeated calls at the same time instant (not in real-world time but the time corresponding to the execution of the dynamic system) are counted as the same call. A block's sample rate can be thought of the interval between successive executions of the block. When a block executes at a particular time, it is said to have a sample hit. If there is no uniform or regular interval between calls, then the block is said have a continuous sample time. If a uniform time interval can be found, then the block is said to have a discrete sample-time equal to that interval. While we confine ourselves to examples with discrete sample time, invention is applicable to even systems containing blocks with continuous sample time.

In the block diagram model 70, signals can include multiple data values. The signal can have a wide range of attributes, such as name, data type (e.g., 8-bit, 16-bit, or 32-bit integer), numeric type (e.g., real or complex), and dimensionality (e.g., one-dimension array, two-dimension array, or multi-dimensional array). The collection of data elements for a given signal is generally stored in a memory buffer that is called a block Input/Output (I/O) buffer because of the association of the signals with the ports of blocks.

Traditionally, block-diagram modeling processes have supported a basic flat buffer model for block I/O. A flat I/O buffer can be described in terms of four major attributes listed below.

A first attribute of a flat I/O buffer is size. Each I/O buffer generally has a fixed memory size (equal to the size of one data element in the buffer times the size of the buffer) and all the memory is allocated once before executing the block diagram. The allocation restriction is imposed to allow efficient real-time execution of a block diagram.

A second attribute of the flat I/O buffer is addressing mode. An I/O buffer is made up of a collection of elements that are accessible sequentially from a base memory address. That is, given a base memory address for the buffer, one can sequentially access the elements in the buffer by using the base address in conjunction with an integer counter that tracks the element index. If, for example, the buffer is a simple C-language array with base pointer address u, then one can access elements of this array as *(u+0) . . . *(u+N−1). Accessing elements beyond the end of the array during block-diagram execution generally results in an error or a memory segmentation violation. We use the common notation u[i] to indicate access to the i-th memory element.

A third attribute of the flat I/O buffer is dimensionality. A dimensionality attribute is usually attached to each I/O buffer in order to allow a set of contiguous memory elements to be interpreted as elements of an M-dimensional matrix. An I/O buffer with N elements can be viewed as a vector of dimensionality [N]. In addition, an I/O buffer could be viewed as matrix of dimensionality [P×Q] with elements from the same column (or columns) appearing adjacent to each other in memory. When a matrix is stored in memory with elements from a column appearing adjacent to each other, the matrix is said to be stored in column-major order. If elements from a row appear adjacent to each other, the matrix is said to be stored in row-major order. In examples used herein we assume that the matrix is stored in column-major order.

Figure 4:
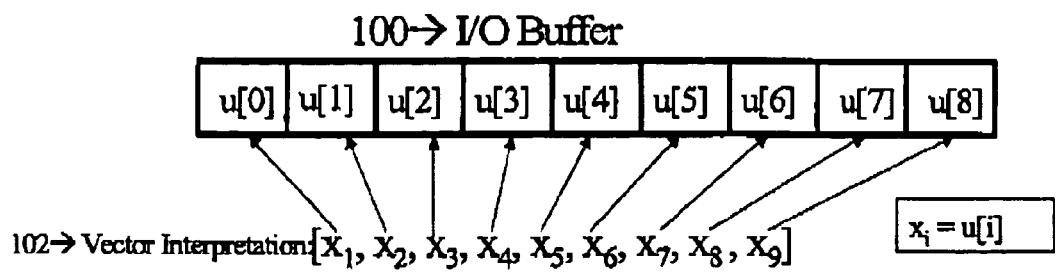
FIG. 4 is a block diagram of an input/output (I/O) buffer.

In FIG. 4, an I/O buffer 100 in memory 18 includes nine elements u[0], u[1], u[2], u[3], u[4], u[5], u[6], u[7], and u[8], and their corresponding vector interpretation 102, in which $x_1$ represents u[0], $x_2$ represents u[1], $x_3$ represents u[2], $x_4$ represents u[3], $x_5$ represents u[4], $x_6$ represents [5], $x_7$ represents u[6], $x_8$ represents u[7], and $x_9$ represents u[8]. In general, $x_i$=u[i].

Figure 5:
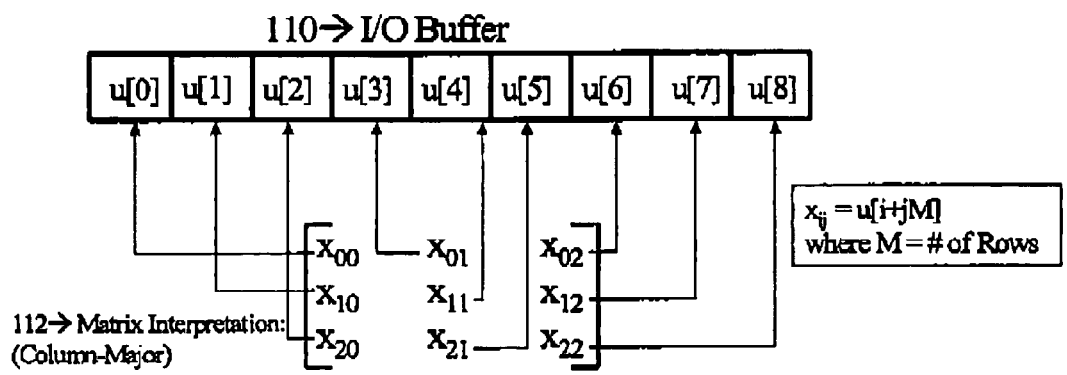
FIG. 5 is a block diagram of an I/O buffer.

In FIG. 5, an I/O buffer 110 in memory 18 includes nine elements u[0], u[1], u[2], u[3], u[4], u[5], u[6], u[7], and u[8], and their corresponding matrix interpretation 112 in column-major order, in which $x_{00}$ represents u[0], $x_{10}$ represents u[1], $x_{20}$ represents u[2], $x_{01}$ represents u[3], $x_{11}$ represents u[4], $x_{21}$ represents u[5], $x_{02}$ represents u[6], $x_{12}$ represents u[7], and $x_{22}$ represents u[8]. In general, $x_{ij}$ represents u[i+jM], where M=the number of rows.

A fourth attribute of the flat I/O buffer is I/O mapping. For a given block, there are two basic types of relationships between the input and output buffers of that block, i.e., disjoint I/O buffers and shared I/O buffers.

With disjoint I/O buffers, blocks supporting this input-output relationship have completely separate input and output buffer spaces. This relationship is used either when the input needs to be persistent even after the output has been generated or when the input and output buffer have different attributes.

In FIGS. 6A, 6B, 6C, 6D, an example illustrating disjoint input and output buffers is shown. The illustration includes a source block 120 and a frame delay block 122. The frame delay block 122 includes an input buffer 124, a state buffer 126 and an output buffer 128. As an optimization, the output buffer of the source block is assumed to be same as the Input buffer of the frame delay block. In block-diagram software, I/O buffers are generally allocated only for block outputs. The input buffer of a block simply points to the output buffer of the block that generates the corresponding input signal. This optimization is assumed to have been carried out in all of our examples. In FIG. 6A, the source block 120 writes (130) directly into the input buffer 124 of the frame delay block 122 because the input buffer of the frame delay block is the same as the output buffer of the source block. This write operation happens when the source block has a sample hit and its Output method is executed. When the Output method of the frame delay block executes at the sample hit of the frame delay block, as shown in FIG. 6B, the state buffer 126 is transferred (132) to the output buffer 128. Next, when the Update method of the frame delay block is then called during the same sample hit, as shown in FIG. 6C, the input buffer 124 is transferred (134) to the state buffer 126. In FIG. 6D, the source block 120 writes (136) next values to the input buffer 124 of the frame delay block 122 when the source block has its next sample hit. In the illustration of FIGS. 6A, 6B, 6C, 6D, the input buffer 124 and the output buffer 128 need to be disjoint because the input buffer values need to be persistent after the output has been generated.

With shared I/O buffers, the output buffer and input buffer have the same memory space. This relationship is generally used in blocks that perform identity data transformations or transformations that can be implemented using in-place computations.

Figure 7A:
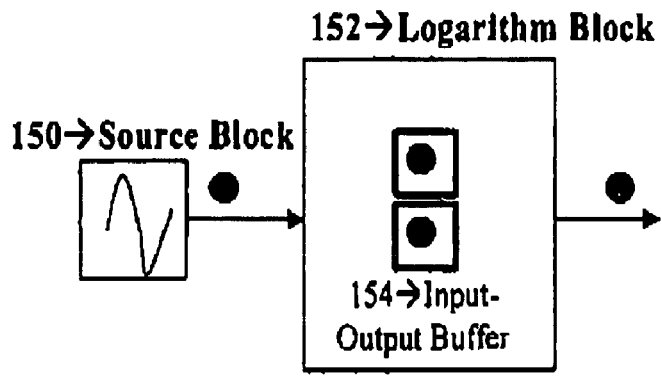
FIGS. 7A, 7B, illustrate shared input and output buffers.
Figure 7B:
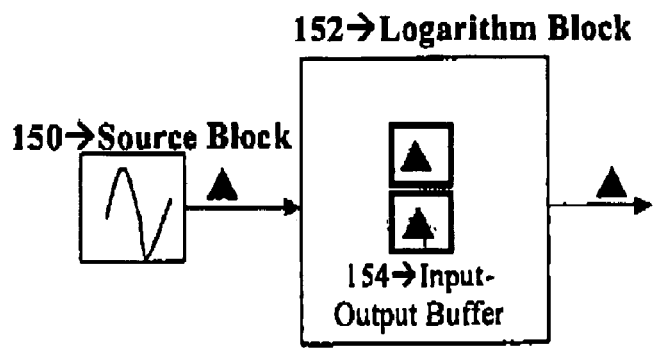

In FIGS. 7A, 7B, an example illustration of how blocks can be implemented to use shared input and output buffers is shown. The illustration includes a source block 150 and a logarithm block 152. The logarithm block 152 includes an input-output buffer 154. In FIG. 7A, the source block 150 writes into the input-output block 154 of the logarithm block 152 when the source block's Output method executes at its sample hit. In FIG. 7B, the logarithm block 152 overwrites input-output buffer 154 with log (input) by using an in-place computation when the Output method of the logarithm block is executes at a sample hit of this block. The logarithm block 152 has a common buffer for both input and output because the block 152 can perform in-place computations.

The Flat I/O Buffer described above allows users to conceptualize and build complex application systems and to generate code (e.g., embeddable code for a hardware platform) for such systems. While the generated code can be made to accurately mimic desired system computations, there can be instances where this generated code could be inefficient, e.g., in terms of memory consumption or computational efficiency or both, when compared to a hand-coded implementation. Such inefficiencies can come as a result of a knowledgeable hand-code programmer using advanced software engineering constructs. We describe below a set of such constructs that can be incorporated into a model for block I/O buffers to achieve better efficiency while generating code from a block-diagram design. For each construct, we provide examples that demonstrate a gain in computational and memory storage efficiency.

Figure 8:
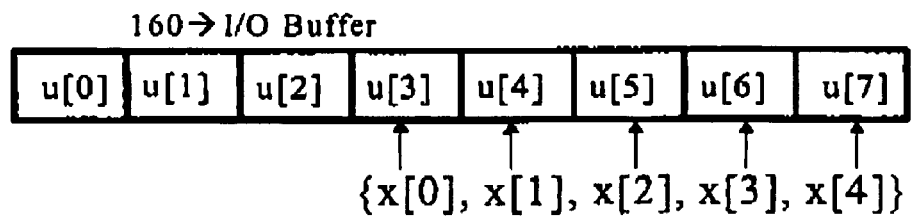
FIG. 8 is a block diagram of an I/O buffer.

In FIG. 8, an I/O buffer 160 using offset addressing is shown. Offset Buffers are I/O buffers in which an entire memory segment allocated for the I/O buffer is not accessed at a given time in a block-diagram's execution. Instead, a portion of the I/O buffer's total memory is accessed beginning at an offset from a starting memory location in the I/O buffer. In other words, if u represents a starting memory address of an offset buffer 162 and x[i] represents the i-th element accessed at a given execution time, then x[i]=u[i+Z], where Z is the offset from the beginning of the offset buffer. Z can be either fixed over the course of a block-diagram's execution or vary at each execution step.

Figure 9:
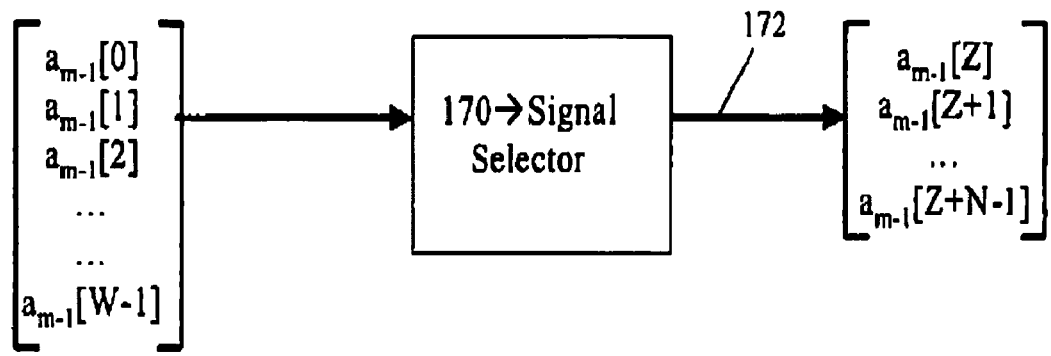
FIG. 9 illustrates a signal selector block.
Figure 9:
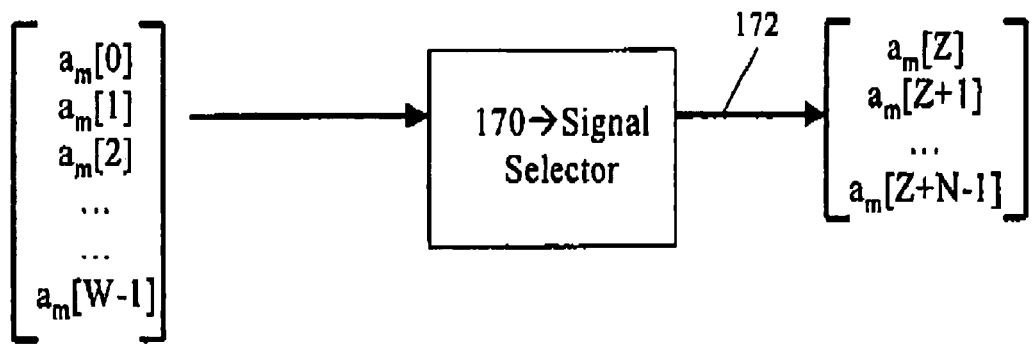

In FIG. 9, a utility of the above offset buffer 162 is illustrated using a signal selector block 170 in a block diagram modeling environment. In Simulink®, a signal selector block generates as output selected elements of an input vector or matrix. A behavior for the signal selector 170 in the block diagram produces an output signal 172 by selecting N consecutive points from an input signal.

Figure 10:
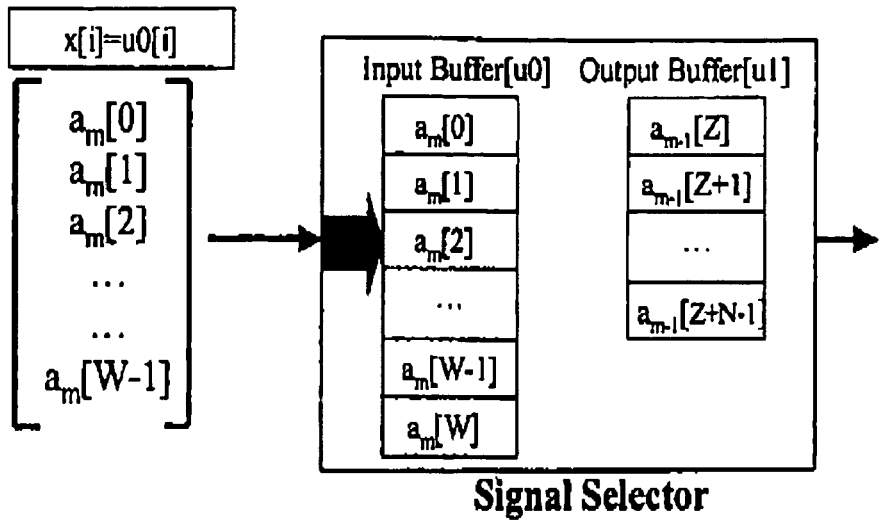
FIG. 10 is a block diagram of a flat I/O buffer.
Figure 10:
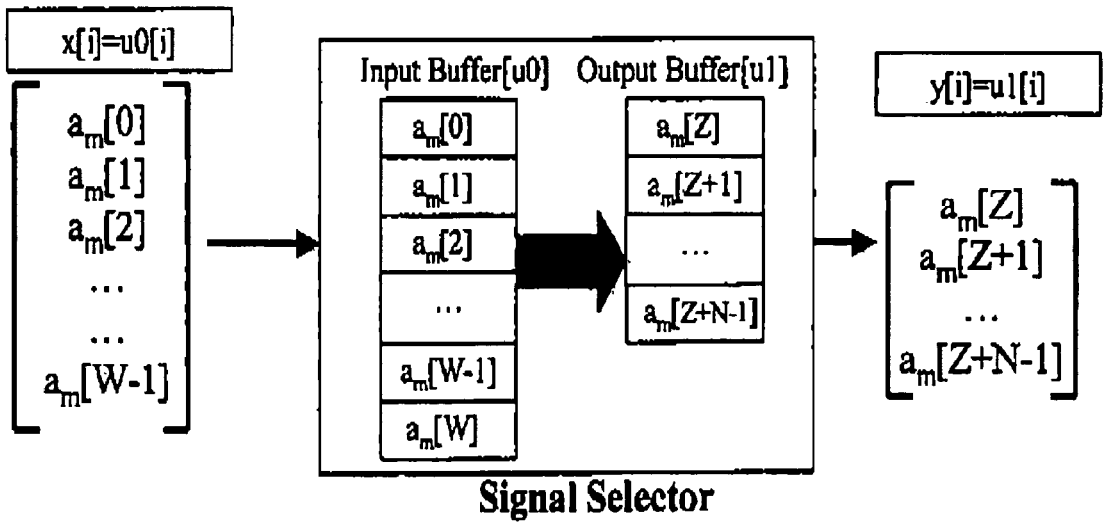

In FIG. 10, an approach for implementing such a buffer block using a flat I/O buffer, with input and output buffers as separate buffers of different lengths, is shown. At each sample hit of the selector block, N contiguous values of the input are copied over to the output buffer; W+N memory elements are needed, W+N copy operations per sample hit.

Figure 11:
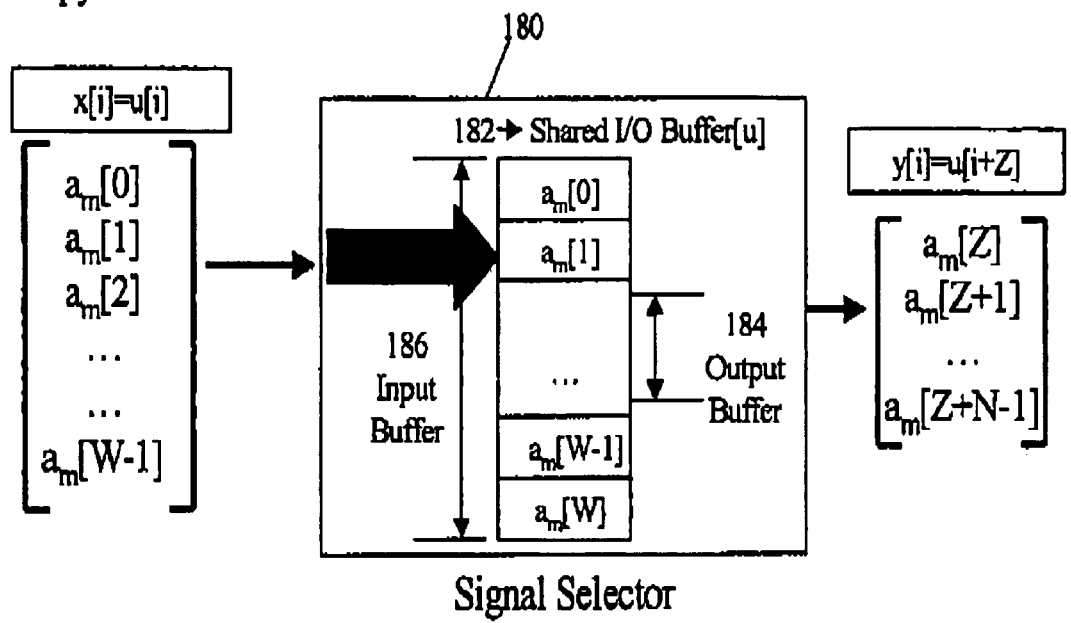
FIG. 11 illustrates a block.

In FIG. 11, the block 180 has a single buffer 182 of length W. At each sample hit, the output buffer 184 is specified to be the same as the input buffer 186 but with an offset of Z=N. We can decrease the memory and number of assignment operations by using an offset buffer for the output buffer 184 of the signal selector block 180; W memory elements are needed, W (or W+1) copy operations per execution step if Z remains fixed (or Z changes) over the execution.

With a flat I/O buffer, one can access the i-th element in a flat buffer by adding the index value i to the base address of buffer and accessing the value at this new address. Therefore, by varying i from 0 . . . N−1, one can access all N elements within the buffer. Now, if i>N, we usually get an error or a memory segmentation violation. In certain examples, it is beneficial to avoid such an error (or violation) and simply wrap around to the start of the memory space when i>N. That is, if u is the base memory address of the I/O buffer, then accessing the i-th element can be written as x[i]=u[i % N], where N is the size of the buffer and % represents the modulo operator.

Figure 12:
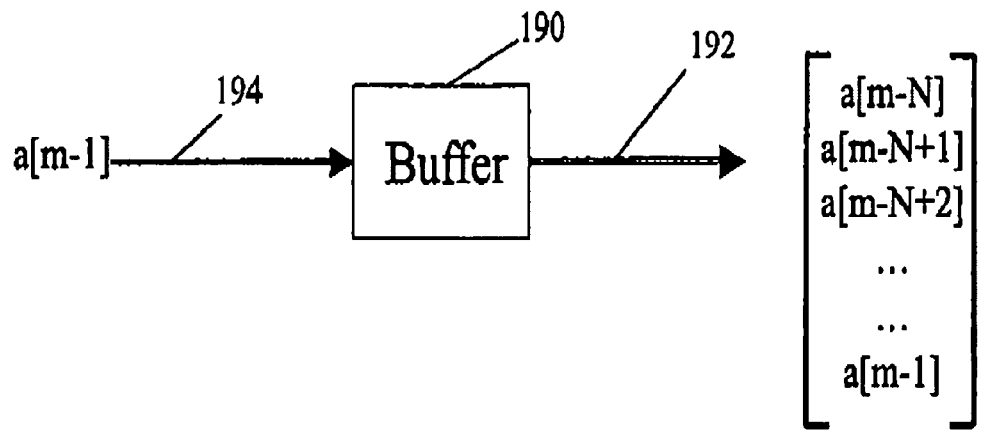
FIG. 12 illustrates a frame buffer block.
Figure 12:
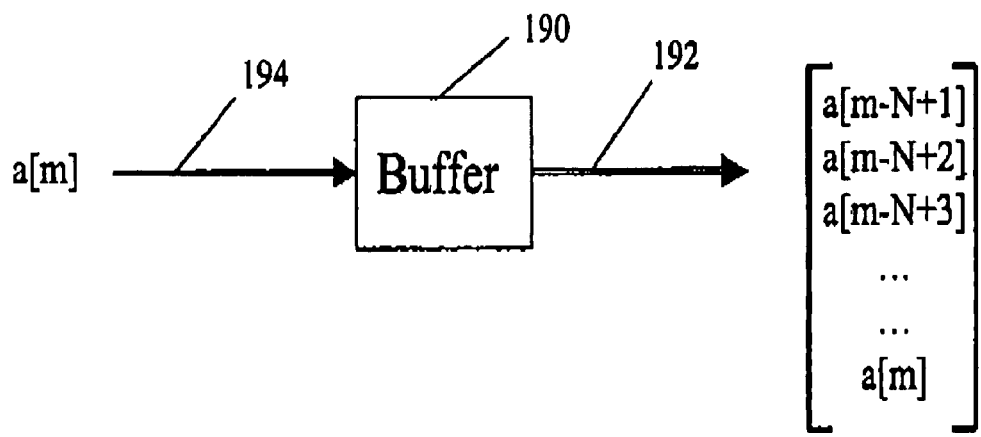

In FIG. 12, a desired behavior for a block 190 that buffers up a frame of data is shown.

Figure 13:
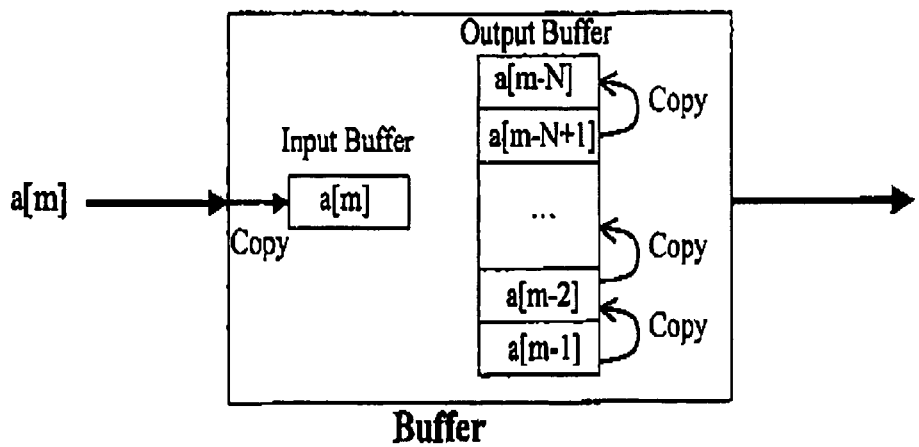
FIG. 13 illustrates a flat I/O buffer.
Figure 13:
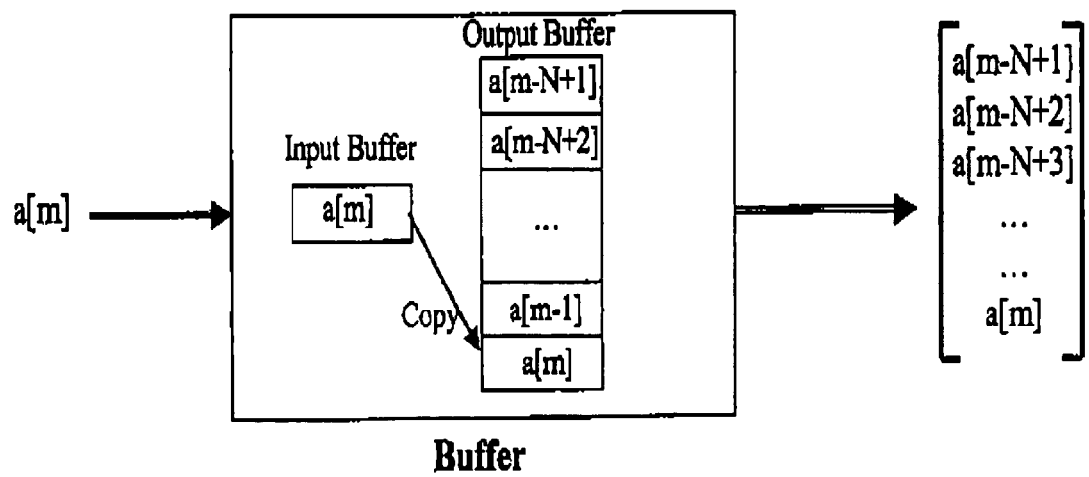

The frame buffer block 190 produces an output signal 192 that is a vector of the previous N samples of the input signal 194. Using a flat buffer implementation, as shown in FIG. 13, the output buffer is a contiguous memory buffer that stores N samples of the input. At each sample hit of the buffer block, previous values in the output buffer are shifted to the memory location preceding their current location. The value at the first memory location is discarded. The value at the last memory location is then updated with the value from the input buffer; N+1 memory elements and N+1 copy operations per sample hit are required resources.

Figure 14:
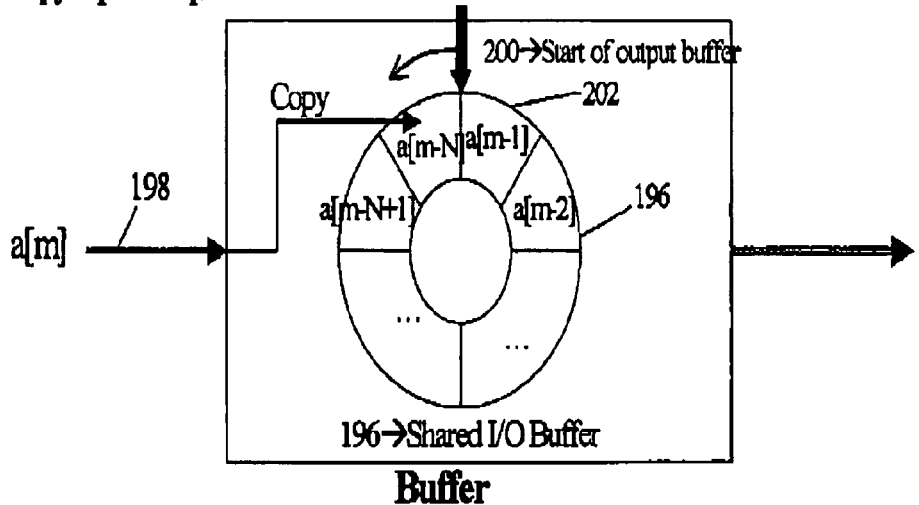
FIG. 14 illustrates a circular I/O buffer.
Figure 14:
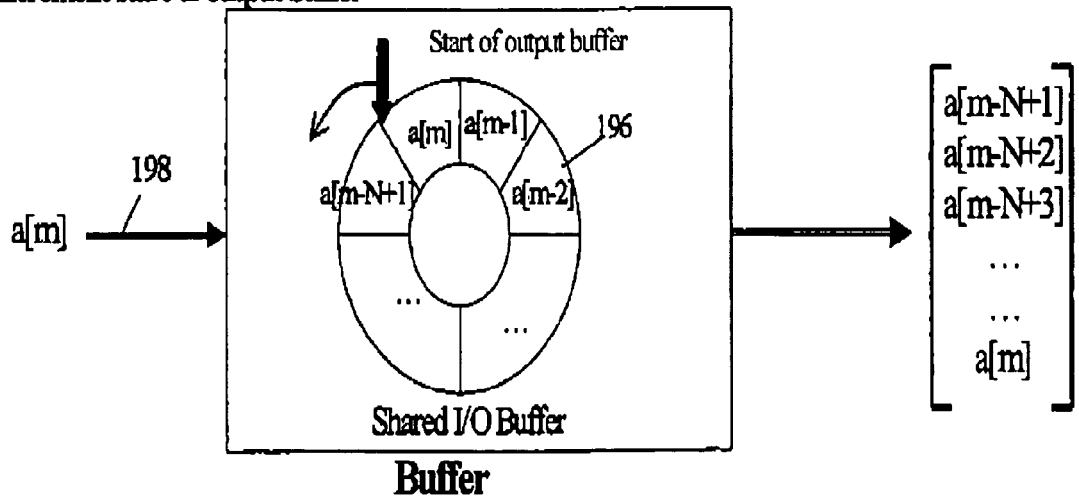

We can substantially decrease the number of assignment operations by using a circular I/O buffer 196 that is shared between the input and output of the block, as shown in FIG. 14. A new input sample 198 is assigned to an appropriate location in the circular buffer 196. The start 200 of the output buffer 202 is then moved by one memory element to "update" the values in the Output buffer 202; N memory elements and one copy operation and one increment operation per execution step are the required resources. The number of computations per execution step is significantly smaller for the Circular Buffer 196 than the Flat Buffer when N is large.

Figure 15:
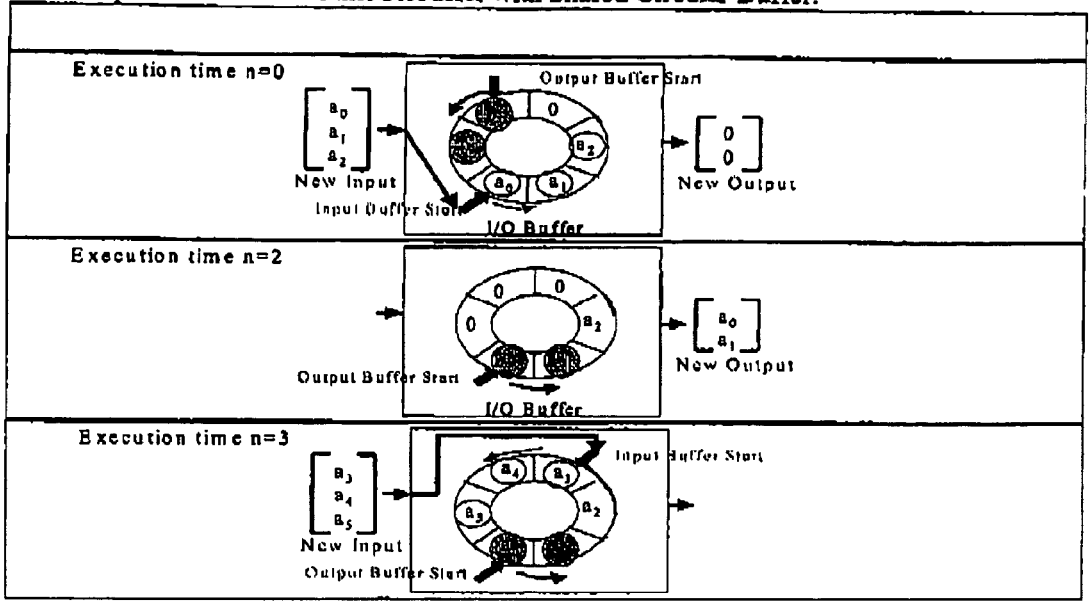
FIG. 15 illustrates a rebuffer block.
Figure 15:
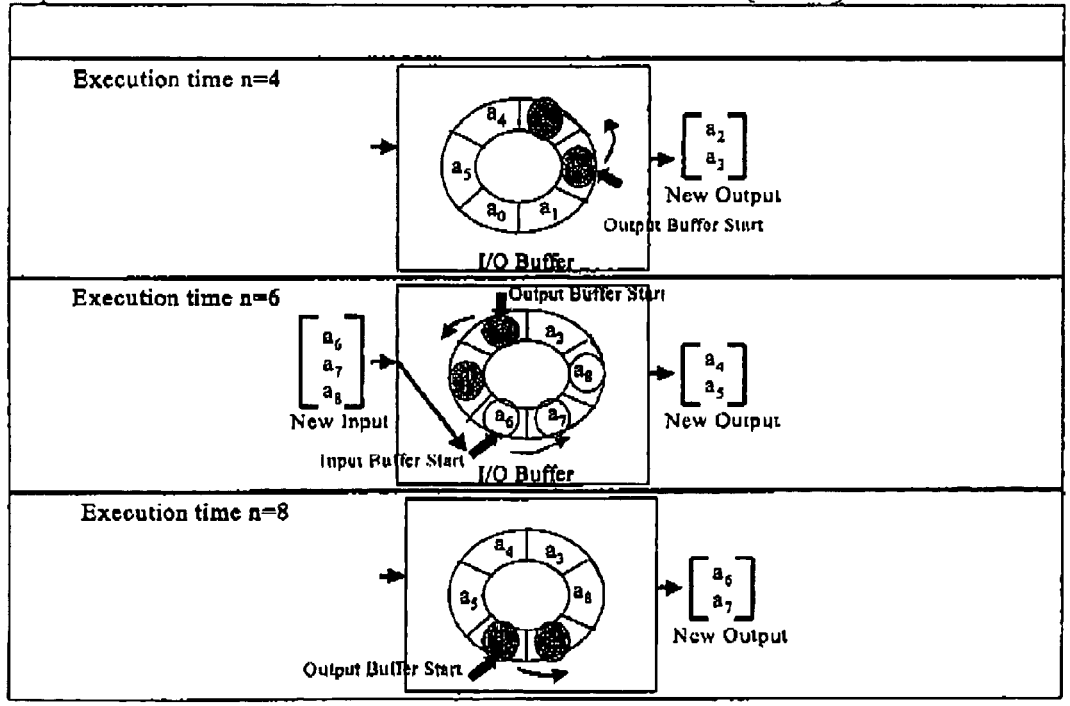

We can decrease both the number of assignment operations and the total memory needed by a frame rebuffer block by using a circular I/O buffer that is shared between the input and output of the block as shown in FIG. 15. New input samples are assigned to an appropriate location in the circular buffer. The start of the output buffer is then moved to "update" the values in the output buffer. In this approach, we only require one assignment operation for producing a new output and four assignment operations every time a new input is available. This approach saves three memory locations and one assignment operation (at each execution step) over the implementation based on the flat buffer.

Figure 16:
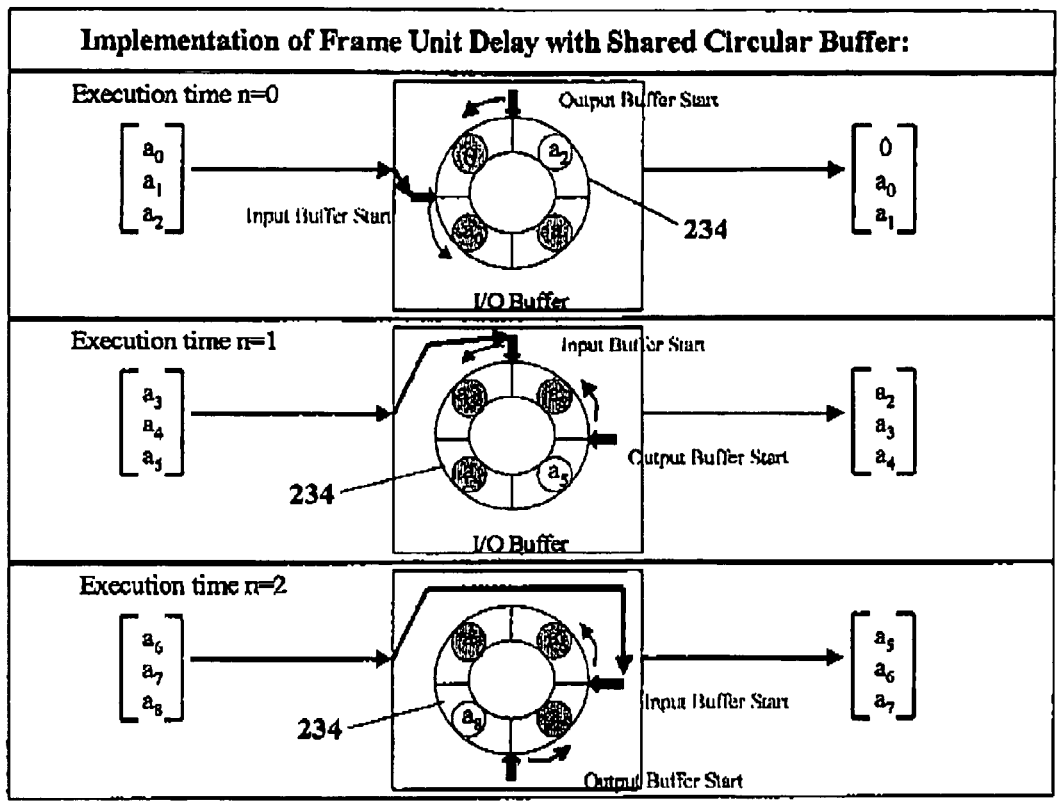
FIG. 16 illustrates a circular I/O buffer.

In FIG. 16, we decrease the number of assignment operations and the total memory needed by a unit delay block by using a circular I/O buffer 234 that is shared between the input and output of the block. The input samples are assigned to an appropriate location in the circular buffer 234 when the delay block has a sample hit. The start of the output buffer is then moved to "update" the values in the output buffer. Resources needed are six memory elements, three copy operations, and two increment operations per execution step. In the general case where the input buffer length is M and the desired delay is N, we need M+N memory elements and M copy operations plus two increment operations per execution step. We see that as M increases, we would get significant savings in both memory and computations over the implementation that uses the Flat Buffer. For example, if M=256, we would save 256 memory locations and 256 copy operations per execution step.

Figure 17:
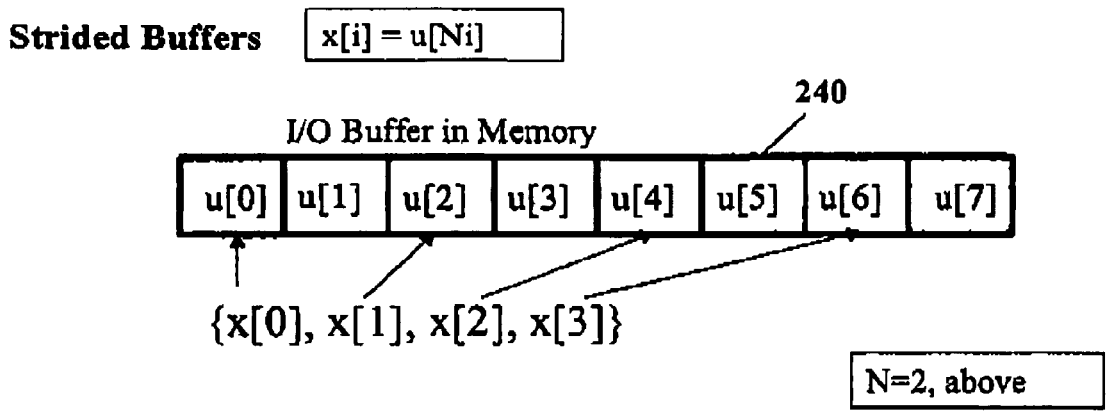
FIG. 17 illustrates an exemplary stride buffer.

In FIG. 17, stride buffer 240 is shown. Using a flat I/O buffer, one can access the elements in the stride buffer 240 by striding sequentially from one element of the buffer to the next. In some application contexts, it is beneficial to use a stride of length greater than one element. For example, a stride length of two results in access of every alternate element in the original buffer, and a stride length of three results in access of every third element in the original buffer. If u is the base address of the I/O buffer, then such stride-based access can be written as x[i]=u[Si], where S is an integer corresponding to the stride factor. S can either be fixed or varying over the course of execution of a block-diagram.

Figure 18:
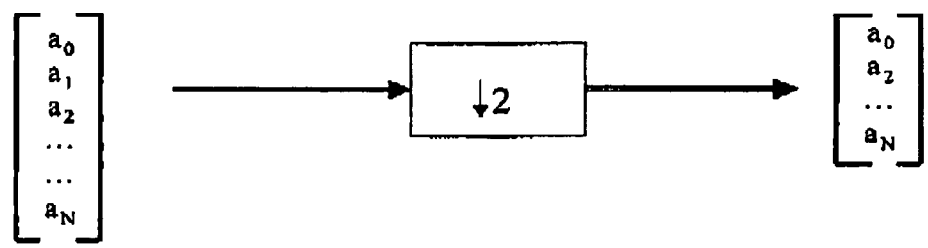
FIG. 18 illustrates a down sampling block.

In FIG. 18, a desired behavior for a block performs down-sampling on a frame input data is shown. Here we assume that the downsampler is reducing the sampling rate by a factor of two for illustrative purposes. We can extend the same concepts to other downsampling rates.

Figure 19:
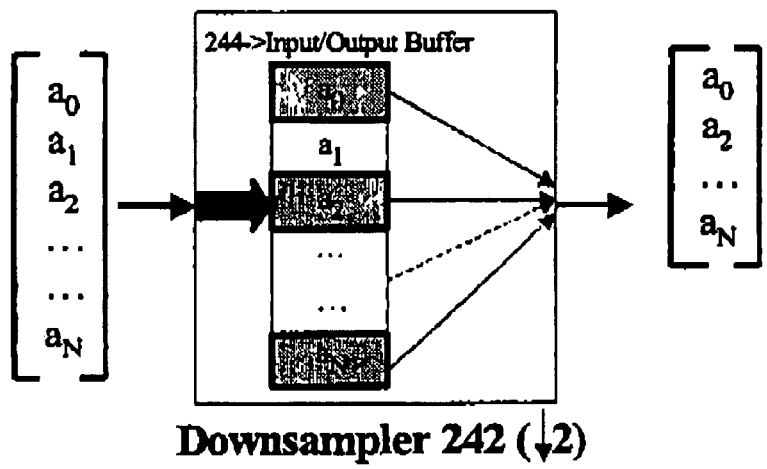
FIG. 19 illustrates a stride buffer.

In FIG. 19, a downsampler 242 implemented as a stride buffer is shown. This implementation results in savings of N/2 memory locations and N/2 assignment operations (every execution step) over an implementation that uses Flat Buffers. At each sample hit of the downsampler block, the downsampler block's I/O buffer is assigned the input values. Since the input and output buffer share the same memory space, the output is updated automatically. Every block that is connected to the Downsampler 242 can get the appropriate input values by simply using stride-based addressing on the downsampler block's output buffer. The resources needed are N memory elements and N copy operations per execution step. This approach results in significant memory and computation savings over the Flat Buffer for large N.

To be able to obtain more optimal memory allocation during the execution of block-diagram models, it becomes necessary to support multiple models of block I/O other than the traditional flat buffer model. Furthermore, it becomes imperative to be able to mix different models of block I/O in the same block-diagram.

Allowing different models of block I/O in the same block-diagram implies that blocks now need the ability to negotiate among them to be able to determine the specific models to use for the various I/O buffers in the model. This is important for two main reasons: (1) the input I/O buffer for one block is the output buffer of another block, and (2) I/O buffers are shared between various blocks when they are marked explicitly as shared buffers. Our invention includes a propagation mechanism that helps determine the most suited memory model for each block I/O buffer in the model.

In order to support multiple models of block I/O, we have also developed a generic block I/O model that helps encompass various buffer models such as offset, circular, and strided illustrated in our earlier examples. We can describe this generic model in terms of the four attributes that we used to describe the traditional Flat Buffer: Size, Addressing Models, Dimensionality, and I/O Mapping.

The size of our block I/O model is assumed to be fixed. We retain the same behavior for size because such fixed-size I/O buffers are the most amenable in the context of real-time systems.

Addressing modes: In the case of a Flat Buffer, a particular element in the I/O buffer was addressed by using two pieces of information: base memory address for the buffer and the element offset of the element that is being currently accessed. Here we assume that an I/O buffer is addressed with five distinct pieces of information:

A first piece of information is base address (u). This is simply the starting memory address of the sequentially accessible elements of the I/O buffer.

A second piece of information is element offset. The i-th element in the I/O buffer can be obtained by using the offset index i in conjunction with the base address. We denote the i-th element in buffer to be x[i] and the access of the i-th memory location in the I/O buffer using the notation u[i].

A third piece of information is wrap-around size (W). This is an integer element index after which the I/O buffer is considered to wrap around on itself. Therefore, the access of the i-th element in the I/O buffer can now be written as: x[i]=u[i % W], where [%] denotes the modulo operator.

A fourth piece of information is starting offset (Z). This is an integer offset that determines the relative position of the first element in the buffer with respect to the base address. For example, a starting offset of Z=5 implies that the first element is given by x[0]=u[i+5].

A fifth piece of information is stride factor (S). In certain cases, every element in an I/O buffer can not simultaneously be in use. Instead, we can only be using every second (or third, or fourth, . . . ) element. Therefore, the i-th element in the I/O buffer would be written as: x[i]=u[Si], where S is the stride factor that determines the spacing between elements in the I/O buffer.

Figure 20:
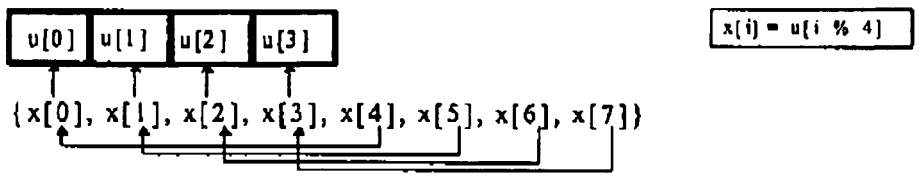
FIG. 20 illustrates addressing-relating attributes.
Figure 20:
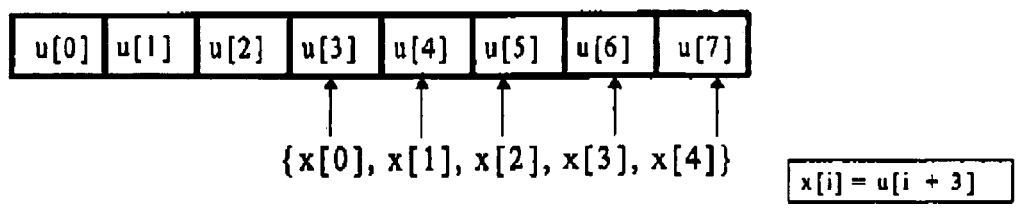
Figure 20:
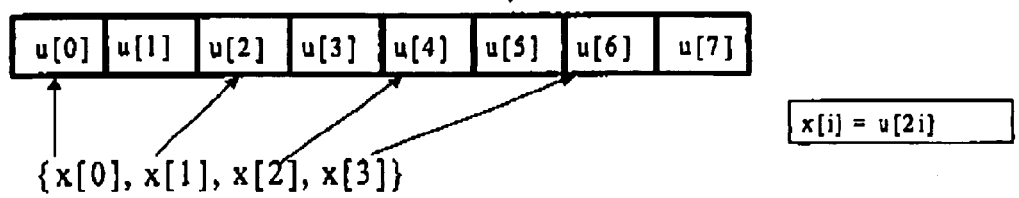

By combining each of the five distinct pieces of information, we would address the i-th element in the I/O buffer as: x[i]=u[(Si+Z)% W]. We note that by choosing S=1, Z=0, and W=infinity, we would obtain the Flat Buffer. The various addressing-related attributes provide offset, circular, and stride addressing as illustrated in FIG. 20. S, Z, and W can be either fixed or dynamically varying over the course of the block-diagram's execution. If these attributes vary with the execution step, then we can rewrite access of the i-th element in the I/O Buffer as: xn[i]=un[(Sni+Zn) % Wn], where n is the execution step.

Figure 21:
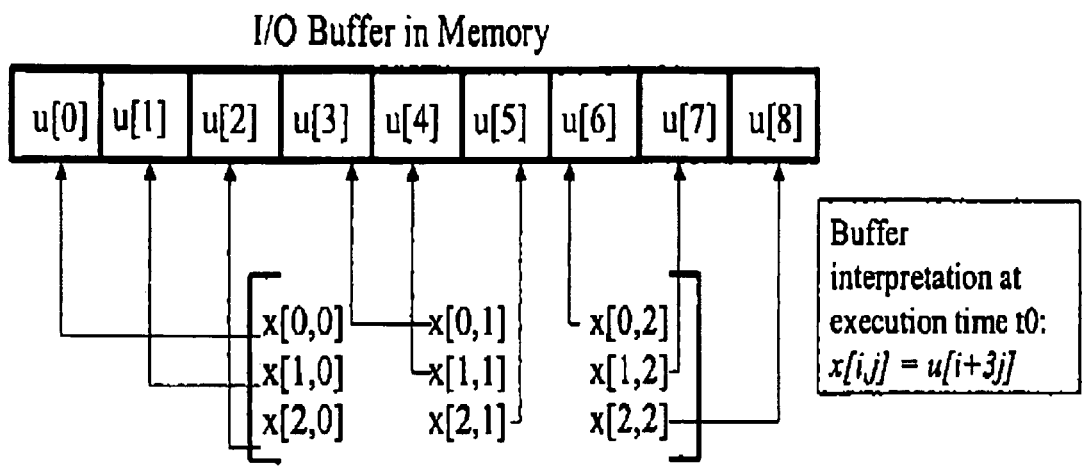
FIG. 21 illustrates a dynamic dimension I/O buffer.
Figure 21:
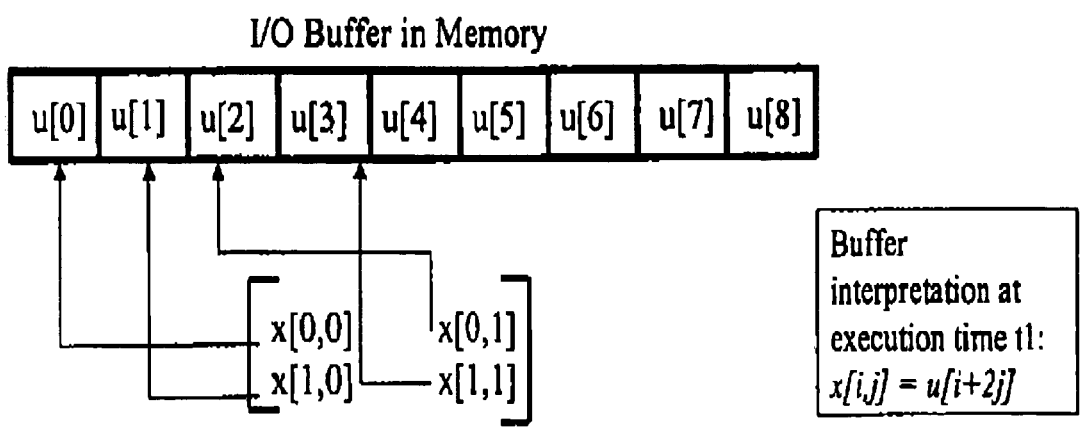
Figure 22:
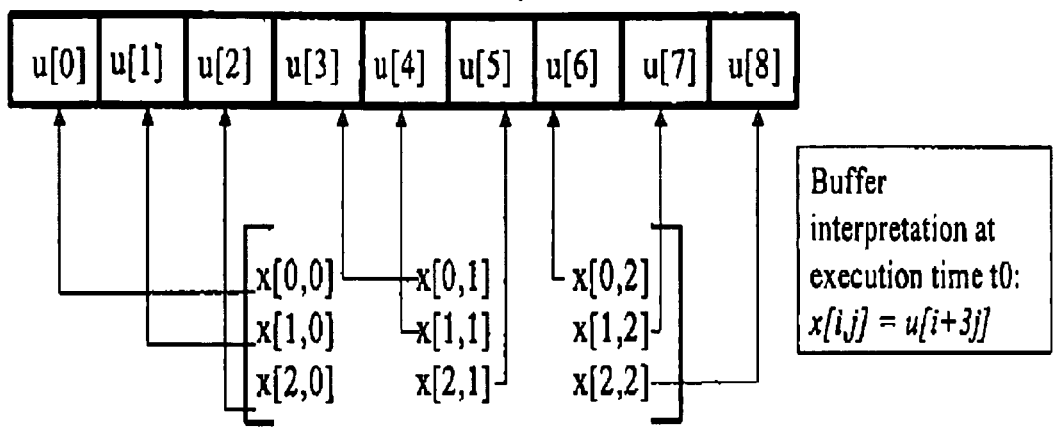
FIG. 22 illustrates a dynamic dimension I/O buffer.
Figure 22:
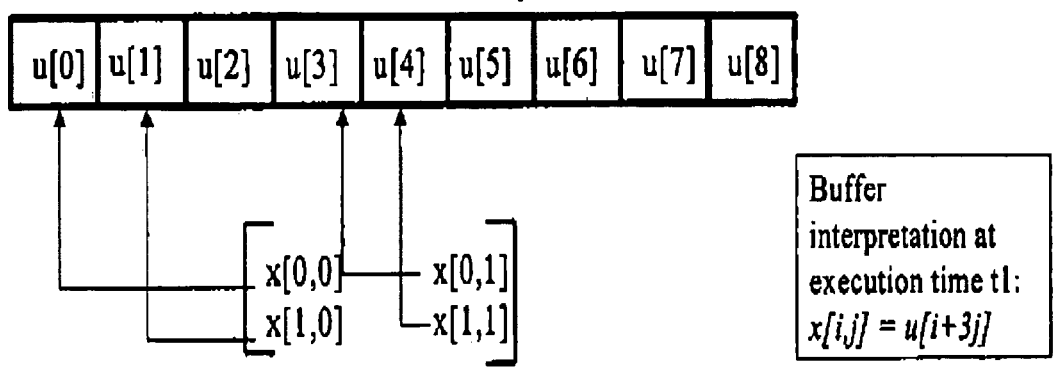

As discussed above, an I/O buffer can be interpreted as an M-dimensional matrix. However, the dimensionality of the buffer was assumed to be unchanging over the course of the block-diagram's execution. In our new model for block I/O buffers, we allow the buffers to have flexible dimensions during the course of the execution of the block-diagram. Two different ways in which I/O buffers can have flexible dimensions are shown in FIG. 21 and FIG. 22. FIG. 21 shows a dynamic dimension I/O buffers. The I/O buffer has dynamic dimensions as the execution proceeds. But the I/O elements are constantly remapped to different elements on the I/O buffer's memory map. FIG. 22 shows the I/O buffer has dynamic dimensions as the execution proceeds. The mapping of individual elements to the memory map of the I/O buffer remains unchanged.

Figure 23:
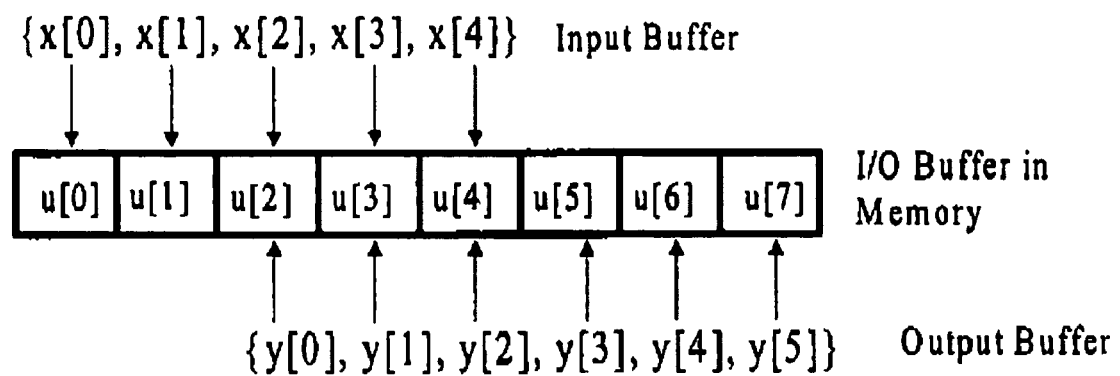
FIG. 23 illustrates partially shared buffers.

In FIG. 23, we introduce a notion of partially shared buffers, i.e., buffers in which the memory spaces for the input and output partially overlap. Here, the input and output buffers share the same memory space. The input buffer is mapped to the first five elements of the memory space and the output buffer is mapped to the last six elements of the same memory space.

While we have focused primarily on time-based block diagrams so far, our invention also extends to other block diagram models of computation where the notion of memory buffers is defined. One such model is data-flow block diagrams that describe a graphical programming paradigm which uses the availability of data (tokens) to drive execution of blocks, where a block represents a single operation and lines represent execution dependencies between the blocks. Our invention can be extended to the memory buffers used to store data tokens in such dataflow block-diagrams.

The invention can be implemented in digital electronic circuitry, or in computer hardware, firmware, software, or in combinations of them. The invention can be implemented as a computer program product, i.e., a computer program tangibly embodied in a machine readable storage device, for execution by, or to control the operation of, data processing apparatus, e.g., a programmable processor, a computer, or multiple computers.

A computer program can be written in any form of programming language, including compiled or interpreted languages, and it can be deployed in any form, including as a stand alone program or as a module, component, subroutine, or other unit suitable for use in a computing environment.

A computer program can be deployed to be executed on one computer or on multiple computers at one site or distributed across multiple sites and interconnected by a communication network.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in special purpose logic circuitry.

A number of embodiments of the invention have been described. Nevertheless, it will be understood that various modifications can be made without departing from the spirit and scope of the invention. Accordingly, other embodiments are within the scope of the following claims.

What is claimed is:

1. In a computing device, a method comprising:
   obtaining, using the computing device, a block diagram model comprising one or more blocks, the one or more blocks having one or more input signals and one or more output signals;
   providing an input/output (I/O) buffer implemented in software, the I/O buffer storing data values of at least one of the one or more input signals or at least one of the one or more output signals;
   using a plurality of block I/O models in the block diagram model, the plurality of block I/O models respectively identifying a manner in which to store the at least one of the one or more input signals and the at least one of the one or more output signals in the I/O buffer, the I/O buffer supporting the plurality of block I/O models;
   determining one of the plurality of block I/O models as a selected block I/O model for the I/O buffer; and
   storing the data values of at least one of the one or more input signals or at least one of the one or more output signals in the I/O buffer consistent with the manner identified by the selected block I/O model.

2. The method of claim 1 where the plurality of block I/O models are represented by attaching to the I/O buffer, in addition to a base address, one or more of the following attributes:
   an element offset;
   a wrap-around size;
   a staffing offset; and
   a stride factor.

3. The method of claim 2 in which the base address is a starting memory address of sequentially accessible elements of the I/O buffer.

4. The method of claim 2 in which the element offset is an offset index i that is used in conjunction with the base address to obtain an ith element in the I/O buffer.

5. The method of claim 2 in which the wrap-around size is an integer index after which the I/O buffer is considered to wrap around on itself.

6. The method of claim 2 in which the starring offset is an integer offset that determines a relative position of a first clement in the I/O buffer with respect to the base address of the I/O buffer.

7. The method of claim 2 in which the stride factor is an integer that represents a spacing between elements in the I/O buffer.

8. The method of claim 2 in which the I/O buffer comprises flexible dimensions.

9. The method of claim 1, wherein the storing farther comprises:
   retaing the data values from at least one of the one or more output signals of one of the one or more blocks.

10. The method of claim 9, further comprising:
    convey the data values from at least one of the one or more output signals of one of the one or more blocks to at least one of the one or more input signals of the one or more blocks within the block diagram model.

11. The method of claim 1 in which the block diagram model is in a time-based simulation domain.

12. The method of claim 1 in which the block diagram model is in a physical modeling computational domain.

13. The method of claim 1 in which the block diagram model is in a data flow computational domain.

14. The method of claim 1 in which the block diagram model is in a graphical programming computational domain.

15. The method of claim 1 in which the plurality of block I/O models differ on each port of a multi-port block.

16. The method of claim 1 further comprising displaying a visual depiction of a block I/O model in the block diagram.

17. The method of claim 1 further comprising generating code of the block diagram model.

18. The method of claim 1, in which the plurality of block I/O models contain complex-valued numberical data.

19. The method of claim 1 in which the plurality of block I/O models contain one of scalar, vector, matrix, and arrays data.

20. The method of claim 1 in which the plurality of block I/O models contain one of numerical value, structure, string, pointer, object, and indirect references thereto.

21. The method of claim 1, wherein the block I/O models comprise a flat buffer, an offset buffer, a circular buffer, a stride buffer and a frame buffer.

22. The method of claim 2, wherein $i^{th}$ element of the I/O buffer is addressed as $x[i]=u[(Si+Z)\%W]$, wherein u represents the base address, W represents the wrap around size, Z represents the starting offset and S represents the stride factor.

23. The method of claim 22, wherein S, Z, and W are fixed values.

24. The method of claim 22, wherein S, Z, and W are dynamically varying values.

25. In a computing device, a method comprising:
    obtaining, using the computing device, a block diagram model comprising one or more blocks, the one or more blocks having one or more input signals and one or more output signals;

providing an input/output (I/O) buffer implemented in software, the I/O buffer storing data values of at least one of the one or more input signals or at least one of the one or more output signals;

using a plurality of block I/O models in the block diagram model, the plurality of block I/O models respectively identifying a manner in which to store the at least one of the one or more input signals and the at least one of the one or more outvut signals in the I/O buffer, the I/O buffer supporting the plurality of block I/O models;

determining one of the plurality of block I/O models as a selected block I/O model for the I/O buffer by negotiating the plurality of block I/O models among the one or more blocks; and storing the data values of at least one of the one or more input signals or at least one of the one or more output signals in the I/O buffer consistent with the manner identified by the selected block I/O model.

26. The method of claim 25 in which the negotiating comprises ranking available block I/O models to influence the selecting the block I/O model.

27. The method of claim 16 in which the visual depiction is a textual annotation of a block I/O model.

28. The method of claim 16 in which the visual depiction is a textual annotation of a block I/O model on a specific line.

29. The method of claim 16 in which the visual depiction is a graphical depiction of a block I/O model as a line style.

30. The method of claim 16 in which the visual depiction is a graphical depiction of a block I/O model as a port indicator of a block.

31. A computer readable storage medium comprising executable instructions. that when executed on a processor, cause a computer to:

obtain a block diagram model comprising one or more blocks, the one or more blocks having one or more input signals and one or more output signals; one or more instructions for providing an input/output (I/O) buffer implemented in software, the I/O) buffer storing data values of at least one of the one or more input signals or at least one of the one or more output signals;

use a plurality of block I/O models in the block diagram model, the plurality of block I/O models respectively identifying a manner in which to store the at least one of the one or more input signals and the at least one of the one or more output signals in the I/O buffer, the I/O buffer supporting the plurality of block I/O models;

determine one of the plurality of block I/O models as a selected block I/O model for the I/O buffer; and store the data values of at least one of the one or more input signals or at least one of one or more output signals in the I/O buffer consistent with the manner identified by the selected block I/O model.

32. The medium of claim 31 wherein the plurality of block I/O models are represented by attaching to the I/O buffer, in addition to a base address, one or more of the following attributes: an element offset, a wrap-around size, a starting offset, and a stride factor.

33. The medium of claim 31, wherein the instructions to store further comprise instructions to:

data values from at least one of the one or more output signals of one of the one or more blocks.

34. The medium of claim 31 in which the block diagram model is in a time-based simulation domain.

35. The medium of claim 31 in which the block diagram model is in a physical modeling computational domain.

36. The medium of claim 31 in which the block diagram model is in a data flow computational domain.

37. The medium of claim 31 in which the block diagram model is in a graphical programming computational domain.

38. The medium of claim 31 in which the block I/O models differ on each port of a multi-port block.

39. The medium of claim 33, further comprising executable instructions, that when executed on a processor, cause the computer to:

convey the data values from at least one of the one or more output signals of one of the one or more blocks to at least one of the one or more input signals of the one or more blocks within the block diagram model.

40. A computer readable storage medium comprising executable instructions, that when executed on a processor, cause a computer to:

obtain a block diagram model comprising one or more blocks, the one or more blocks having one or more input signals and one or more output signals;

provide an input/output (I/O) buffer implemented in software, the I/O buffer storing data values of at least one of the one or more input signals or at least one of the one or more output signals;

use a plurality of block I/O models in the block diagram model, the plurality of block I/O models respectively identifying a manner in which to store the at least one of the one or more innut signals and the at least one of the one or more output signals in the I/O buffer, the I/O buffer supporting the plurality of block I/O models;

determine one of the plurality of block I/O models as a selected block I/O model for the I/O buffer by negotiating the plurality of block I/O models among the one or more blocks; and store the data values of at least one of the one or more input signals or at least one of the one or more output signals in the I/O buffer consistent with the manner identified by the selected block I/O model.

41. The medium of claim 40 in which the negotiating comprises ranking available block I/O models to influence the selecting block I/O model.

42. In a computing device, a method comprising:

obtaining, using the computing device, a block diagram model comprising one or more blocks, the one or more blocks being associated with a plurality of signals;

identifying one of the plurality of signals associated with a block in the block diagram model;

operating a block input/output (I/O) buffer implemented in software, the block I/O buffer storing data values of the identified one of the plurality of signals associated with the block;

using a plurality of block I/O models in the block diagram model, the plurality of block I/O models respectively identifying a manner in which to store the at least one of the one or more input signals and the at least one of the one or more output signals in the I/O buffer, the block I/O buffer supporting the plurality of block I/O models;

determining one of the plurality of block I/O models as a selected block I/O model for the block I/O buffer consistent with the identified one of the plurality of signals;

storing data values of the identified one of the plurality of signals in the block I/O buffer consistent with the manner identified by the selected block I/O model.

* * * * *

UNITED STATES PATENT AND TRADEMARK OFFICE
CERTIFICATE OF CORRECTION

| | | |
|---|---|---|
| PATENT NO. | : 7,478,016 B2 | Page 1 of 1 |
| APPLICATION NO. | : 10/417404 | |
| DATED | : January 13, 2009 | |
| INVENTOR(S) | : Donald Paul Orofino, II et al. | |

It is certified that error appears in the above-identified patent and that said Letters Patent is hereby corrected as shown below:

In the specification at column 2, line 66, please change "represents a" to --represents--.

In the specification at column 7, line 44, please change "lengths, is" to --lengths is--.

In the specification at column 10, line 8, please change "fourth,..." to --fourth...--.

In the claims at column 12, line 6, claim 6, please change "starring" to --starting--.

In the claims at column 12, line 21, claim 9, please change "retaing" to --retaining--.

In the claims at column 12, line 43, claim 18, please change "numberical" to --numerical--.

In the claims at column 13, line 9, claim 25, please change "outvut" to --output--.

In the claims at column 14, line 27, claim 40, please change "innut" to --input--.

Signed and Sealed this

Seventeenth Day of March, 2009

JOHN DOLL
*Acting Director of the United States Patent and Trademark Office*